United States Patent
Asaishi

(10) Patent No.: US 6,882,407 B2
(45) Date of Patent: Apr. 19, 2005

(54) EXPOSURE APPARATUS

(75) Inventor: Tadahiro Asaishi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/724,737

(22) Filed: Dec. 2, 2003

(65) Prior Publication Data

US 2004/0119963 A1 Jun. 24, 2004

(30) Foreign Application Priority Data

Dec. 2, 2002 (JP) .................................... 2002-350236

(51) Int. Cl.$^7$ .................. G03B 27/74; G03B 27/42
(52) U.S. Cl. ................................ 355/68; 355/53
(58) Field of Search .................. 355/30, 53, 67–71; 356/399–401; 250/548

(56) References Cited

U.S. PATENT DOCUMENTS

| | | | | |
|---|---|---|---|---|
| 5,581,324 A | * | 12/1996 | Miyai et al. | 355/53 |
| 5,894,341 A | * | 4/1999 | Nishi et al. | 355/68 |
| 6,259,510 B1 | * | 7/2001 | Suzuki | 355/53 |
| 6,744,492 B2 | * | 6/2004 | Takahashi et al. | 355/69 |

FOREIGN PATENT DOCUMENTS

JP          9-22120          1/1997

* cited by examiner

*Primary Examiner*—Henry Hung Nguyen
(74) *Attorney, Agent, or Firm*—Fitzpatrick, Cella, Harper & Scinto

(57) ABSTRACT

An exposure apparatus which has a light source and transfers a pattern of an original to a substrate using light supplied from the light source includes a photoelectric sensor used to control an amount of light to which the substrate is exposed, a memory storing a first value for correcting an output value of the photoelectric sensor with respect to each accumulated energy of light, having a first power, with which the photoelectric sensor is irradiated, a calculator which calculates a second value for correcting an output value of the photoelectric sensor corresponding to a second accumulated energy of light, having a second power, with which the photoelectric sensor is irradiated, based on the first value in the memory corresponding to the second accumulated energy, and a ratio of the second power to the first power, and a correction unit which corrects an output value of said photoelectric sensor using the second value.

9 Claims, 9 Drawing Sheets

WAVEFORM WHEN OPERATING WITH MAXIMUM OSCILLATION FREQUENCY

WAVEFORM WHEN NON-OPERATING PERIODS ARE INSERTED

WAVEFORM WHEN OSCILLATION FREQUENCY IS CHANGED

EXPOSURE APPARATUS

FIELD OF THE INVENTION

An exposure apparatus, which transfer the pattern of a master such as a reticle onto a substrate such as a wafer or glass plate, coated with a photosensitive agent, is used to manufacture a device such as a semiconductor device or liquid crystal display device by photolithography.

BACKGROUND OF THE INVENTION

An exposure apparatus which transfers the pattern of a master such as a reticle onto a substrate such as a wafer or glass plate, coated with a photosensitive agent, is used to manufacture a device such as a semiconductor device or liquid crystal display device by photolithography.

Exposure apparatuses include a step & repeat exposure apparatus (a so-called stepper), a step & scan exposure apparatus (a so-called scanner or scanning exposure apparatus), and the like. The step & repeat exposure apparatus transfers a reticle pattern onto each shot region on a wafer while holding a wafer stage on which the wafer is mounted still. On the other hand, the step & scan exposure apparatus scans a reticle and wafer relative to a projection optical system while projecting part of a reticle pattern onto the wafer through the projection optical system, thereby transferring the reticle pattern onto each shot region on the wafer.

Operation of an exposure apparatus can be classified into normal exposure which transfers a reticle pattern onto a wafer and measurement exposure which measures the illuminance uniformity and the like on an exposure field.

FIG. 9 is a view showing the schematic arrangement of a conventional exposure apparatus. Note that an exposure apparatus shown in FIG. 9 can be implemented either as a stepper or as a scanner. Referring to FIG. 9, an excimer laser 1 serving as a pulse light source emits pulsed illumination light. Illumination light from the excimer laser 1 is shaped into a parallel beam having a desired sectional shape by a beam shaping optical system 2. Linearly polarized illumination light having passed through the beam shaping optical system 2 is converted into circularly polarized illumination light by a quarter-wave plate 3. The circularly polarized illumination light is reflected by a reflecting mirror 4 and is guided to a fly-eye lens 5. Many light source images are formed on the exit surface of the fly-eye lens 5, thereby making the illuminance distribution of the illumination light uniform.

A beam splitter 6 transmits most of illumination light having passed through the fly-eye lens 5 to input it to a lens group 7 and reflects the remaining part of illumination light to input it to an integrated exposure amount sensor 15. The lens group 7 illuminates a reticle (master) 9 with a uniform illuminance distribution. In this example, a reflecting mirror 8 is arranged in the lens group 7.

A pattern of the reticle 9 illuminated with illumination light is projected and transferred onto a wafer (substrate) 11 via a projection optical system 10. The wafer 11 is mounted on a wafer stage (substrate stage) 12 and is moved or aligned by the wafer stage 12. This makes it possible to transfer a pattern onto a target shot region on the wafer. An illuminance uniformity sensor 13 is arranged on the wafer stage 12 and is used only in measurement exposure.

Light reflected by the beam splitter 6 is condensed on the integrated exposure amount sensor 15 by a condenser lens 14. The integrated exposure amount sensor 15 can be used not only in indirect monitoring of the exposure amount of the wafer during normal exposure but also in measurement exposure. A main control system 16 controls the excimer laser 1 on the basis of output signals from the illuminance uniformity sensor 13 and integrated exposure amount sensor 15, thereby controlling exposure of the wafer.

As is commonly known, each photoelectric sensor (the illuminance uniformity sensor 13 or integrated exposure amount sensor 15) used for an exposure apparatus changes in sensitivity due to a change in temperature of the light-receiving surface, and this affects the exposure accuracy.

For example, in exposure amount control, the excimer laser 1 is controlled on the basis of an output signal from the integrated exposure amount sensor 15, thereby adjusting the exposure amount of the wafer. If the integrated exposure amount sensor 15 changes in sensitivity due to a change in temperature, an actual exposure amount of the wafer cannot be detected or estimated. Consequently, the exposure amount control accuracy decreases.

In addition, if the illuminance uniformity sensor 13 changes in sensitivity in measurement of the illuminance uniformity on an exposure field, a measurement error may occur. For example, a scanner can utilize an output signal from the illuminance uniformity sensor 13 to correct illuminance nonuniformity using a slit or the like. Hence, a change in sensitivity of the illuminance uniformity sensor 13 can result in illuminance nonuniformity in normal exposure.

FIG. 2 is a view showing the relationship among an exposure region (a region to be exposed), an illumination region, and the illuminance uniformity sensor 13. In normal exposure, the wafer stage 12 is driven in a scanning direction such that an exposure region 18 passes by immediately below a slit illumination region 17 at a constant velocity. On the other hand, in measurement exposure, the wafer stage 12 is driven such that the illuminance uniformity sensor 13 is located immediately below the slit illumination region 17, thereby measuring the illuminance uniformity.

For example, to measure the illuminance uniformity in a slit direction (the longitudinal direction of a slit), the illuminance uniformity sensor 13 starts measurement from a point Y1 in FIG. 2 and measures the illuminance uniformity of a region extending to a point Y2 at regular intervals. At this time, the quantity of light (integrated light quantity) with which the illuminance uniformity sensor 13 is irradiated increases as the illuminance uniformity sensor 13 moves from a start position (Y1) to an end position (Y2). This causes a rise in temperature on the light-receiving surface of the illuminance uniformity sensor 13, thus resulting in a change in sensitivity of the illuminance uniformity sensor 13. FIG. 3 is a graph showing an example of a change in sensitivity of the illuminance uniformity sensor 13 which may occur while the illuminance uniformity sensor 13 is moving in the slit direction. A change in sensitivity of the illuminance uniformity sensor 13, as shown in FIG. 3, decreases the measurement accuracy of illuminance or illuminance uniformity.

In recent years, the oscillation frequency of a pulse light source is increasing along with an increase in throughput of an exposure apparatus. For this reason, a change in sensitivity due to a change in temperature of a photoelectric sensor may greatly affect the exposure accuracy.

As a prior art reference that is related to such a problem, there is available Japanese Patent Laid-Open No. 9-22120. An apparatus disclosed in this reference comprises a photoelectric sensor which measures the light quantity of a light beam as part of illumination light and a temperature detection means for detecting the temperature on the light-receiving surface of the photoelectric sensor. The apparatus corrects a change in sensitivity caused by a change in temperature of the photoelectric sensor on the basis of the temperature detected by the temperature detection means. The above reference also discloses an apparatus which comprises a photoelectric sensor which measures the light quantity of a light beam as part of illumination light, a temperature detection means for detecting the temperature on the light-receiving surface of the photoelectric sensor, and a temperature control means for controlling the temperature on the light-receiving surface of the photoelectric sensor. The apparatus controls the temperature control means on the basis of a value detected by the temperature detection means, stabilizes the temperature on the light-receiving surface of the photoelectric sensor, and keeps constant a change in sensitivity caused by a change in temperature.

However, it is difficult for the apparatuses disclosed in Japanese Patent Laid-Open No. 9-22120 to accurately correct an effect caused by a change in sensitivity due to a change in temperature. More specifically, even if the temperature detection means is arranged in the vicinity of the light-receiving surface of the photoelectric sensor, a slight difference in temperature occurs between the photoelectric sensor and the temperature detection means because they are separately provided. This disables accurate detection of the temperature on the light-receiving surface of the photoelectric sensor and accurate stabilization of the sensitivity of the photoelectric sensor. Accordingly, it is difficult to detect or estimate the accurate integrated exposure amount on a wafer.

The provision of a temperature detection means and temperature control means, as in the apparatuses disclosed in the patent publication, increases the complexity of the arrangement of a wafer stage and reduces the temperature stability. This may pose problems such as a decrease in performance of, e.g., a wafer stage and an increase in cost of the apparatus.

SUMMARY OF THE INVENTION

The present invention has been made in consideration of the above-mentioned background, and has as its object to, e.g., accurately correct an output variation due to a change in temperature of a photoelectric sensor.

An exposure apparatus according to the present invention is arranged to transfer a pattern of a master onto a substrate using light emitted from a light source. The apparatus comprises a photoelectric sensor arranged at a predetermined position to control exposure of the substrate, a memory that stores an output variation characteristic of the photoelectric sensor with respect to a quantity of light with which the photoelectric sensor is irradiated, a calculator that calculates an output variation amount of the photoelectric sensor on the basis of the quantity of the light with which the photoelectric sensor is irradiated, energy per unit time of the light, and the output variation characteristic stored in the memory, and a compensator that corrects an output from the photoelectric sensor on the basis of the output variation amount calculated by the calculator.

An exposure apparatus according to the present invention can be implemented as a stepper, scanner, or any other type of exposure apparatus.

The photoelectric sensor may be, e.g., a photodiode. In addition to this, any sensor can be employed as long as it converts light into electrical signals. The memory can employ any arrangement (e.g., a RAM, a ROM, a hard disk, or a logic circuit) as long as it stores information so as to allow provision of the information. The calculator and/or compensator can employ any arrangement for performing calculation, such as a CPU, which operates in accordance with software, a logic circuit, which has an arithmetic function defined using hardware, or the like. Each of the calculator and compensator may be comprised of a single processor. The light source may be, e.g., an excimer laser. In addition to this, any apparatus or arrangement can be employed as long as it generates light for exposure.

According to a preferred embodiment of the present invention, the calculator can be arranged to obtain information that indicates the quantity of the light with which the photoelectric sensor is irradiated and the energy per unit time of the light on the basis of information for controlling the light source.

The light source may be, e.g., a pulse light source that generates pulse light. The information may be information that indicates energy per pulse and the number of pulses of the pulse light generated by the light source. In this case, the calculator can be arranged to calculate the quantity of the light with which the photoelectric sensor is irradiated on the basis of the number of pulses and the energy per pulse. Alternatively, the information may be information that indicates an oscillation frequency, oscillation duty, and energy per pulse of the light source. In this case, the calculator can be arranged to calculate the energy per unit time on the basis of the oscillation frequency, oscillation duty, and energy per pulse.

The photoelectric sensor can include an integrated exposure amount sensor for monitoring an integrated exposure amount of the substrate during exposure of the substrate. In addition to or instead of this, the photoelectric sensor may include a sensor arranged on a stage to move the substrate such as an illuminance uniformity sensor that measures an illuminance uniformity in an exposure region.

According to another aspect of the present invention, there is provided an exposure method. The method is an exposure method of transferring a pattern of a master onto a substrate using light emitted from a light source and can comprise a calculation step of calculating an output variation amount of a photoelectric sensor arranged at a predetermined position to control exposure of the substrate on the basis of a quantity of light with which the photoelectric sensor is irradiated, energy per unit time of the light, and an output variation characteristic of the photoelectric sensor stored in a memory, a correction step of correcting an output from the photoelectric sensor on the basis of the output variation amount calculated in the calculation step, and an exposure step of controlling exposure of the substrate on the basis of the output from the photoelectric sensor corrected in the correction step. The output variation characteristic stored in the memory can include a characteristic of the output variation amount of the photoelectric sensor with respect to the quantity of the light with which the photoelectric sensor is irradiated.

The present invention can further be recognized as a device manufacturing method. The method can comprise a step of transferring a pattern of a master onto a substrate using the above-mentioned exposure apparatus or exposure method, and a step of developing the substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENT

Figure 1:
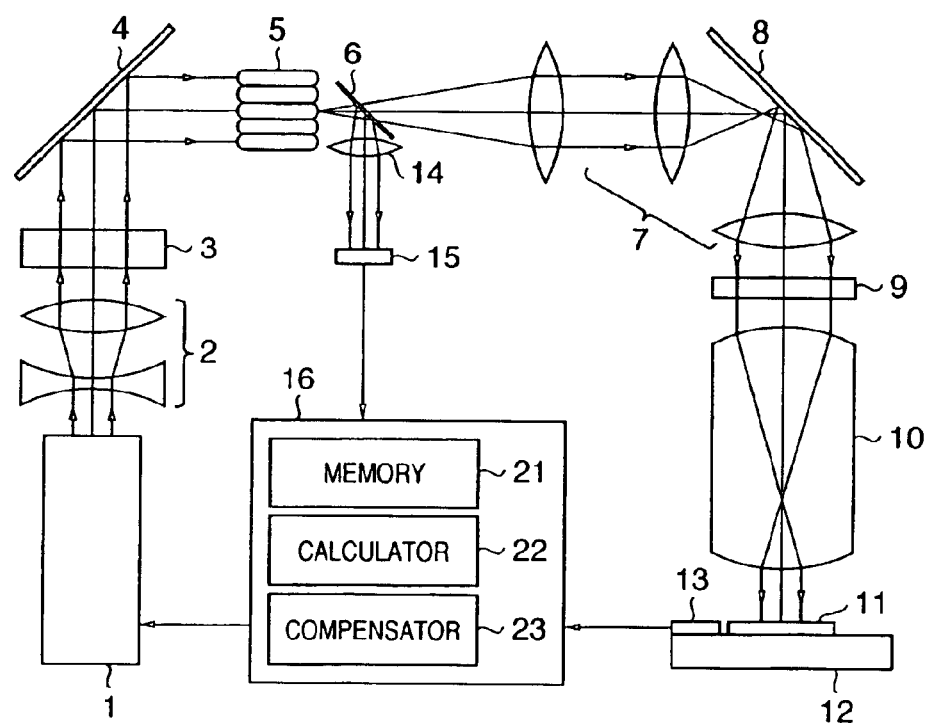
FIG. 1 is a view showing the schematic arrangement of an exposure apparatus according to a preferred embodiment of the present invention.
Figure 2:
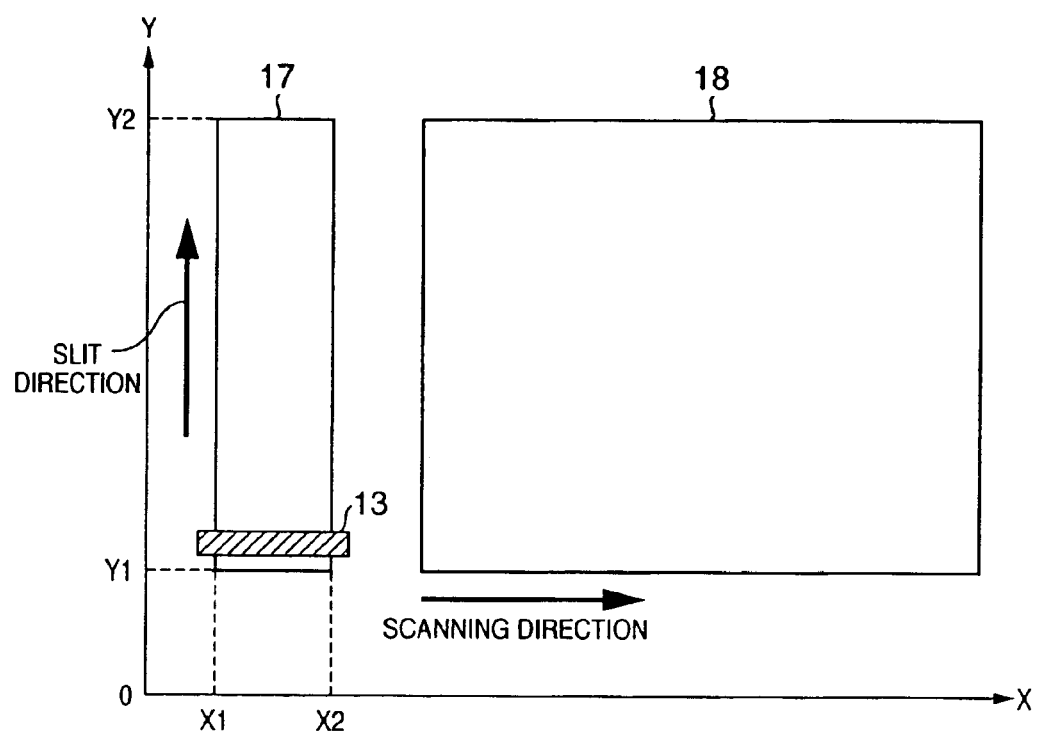
FIG. 2 is a view showing the relationship among an exposure region, illumination region, and illuminance uniformity sensor.
Figure 3:
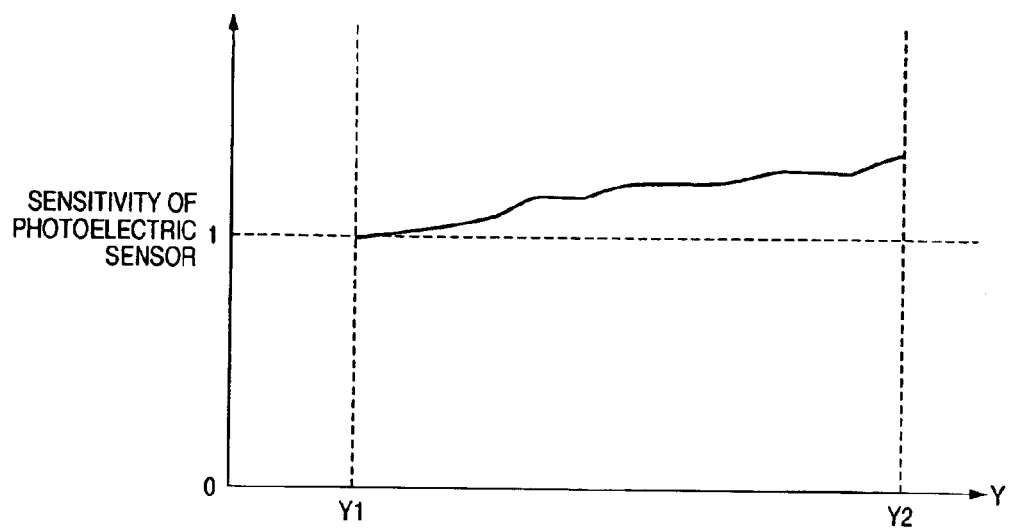
FIG. 3 is a graph showing an example of a change in sensitivity of an illuminance uniformity sensor 13 which may occur while the illuminance uniformity sensor 13 is moving in a slit direction.
Figure 9:
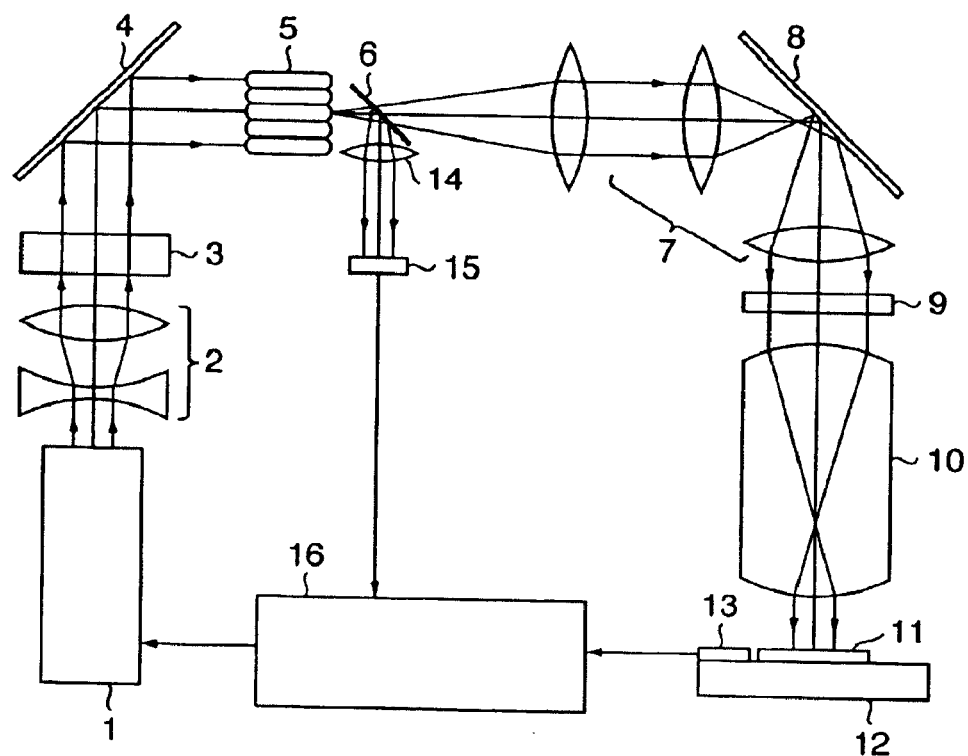
FIG. 9 is a view showing the schematic arrangement of a conventional exposure apparatus.

A specific application example of the present invention will be exemplified below with reference to the accompanying drawings. FIG. 1 is a view showing the schematic arrangement of an exposure apparatus according to a preferred embodiment of the present invention. Note that the same reference numerals as in FIG. 9 denote the same parts, and a description thereof will be omitted.

Figure 4A:
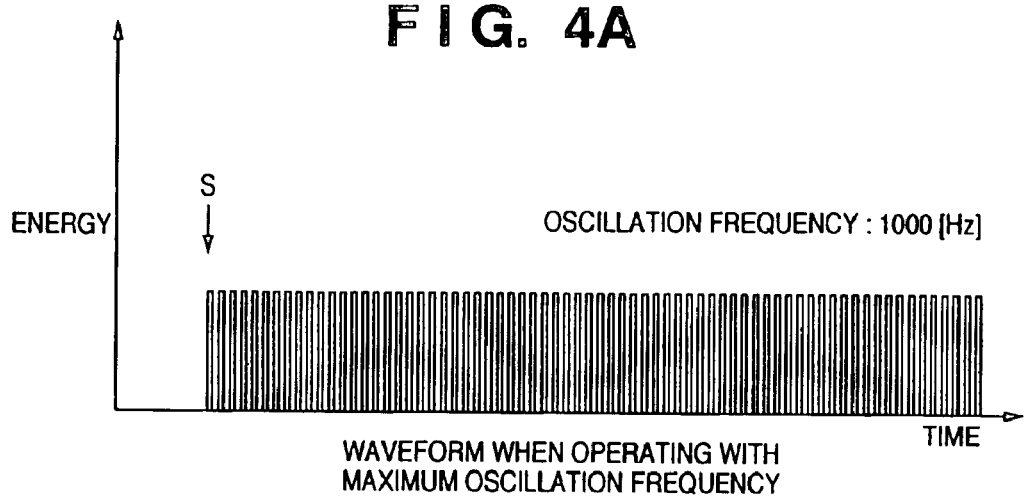
FIGS. 4A to 4C are charts for explaining a change in duty caused by changing the oscillation conditions (the oscillation frequency and oscillation duty) of an excimer laser.
Figure 4B:
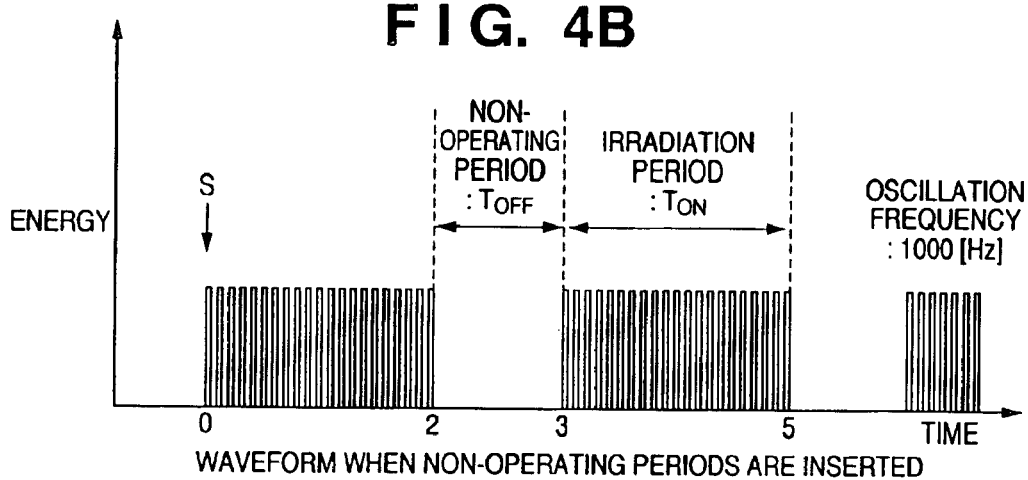
Figure 4C:
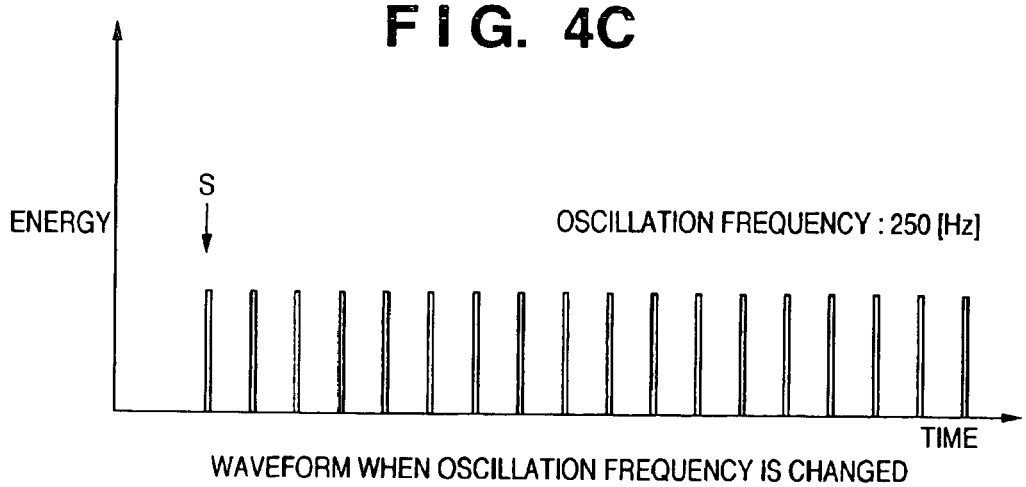

First, an excimer laser 1 as an example of a pulse light source will be described with reference to FIGS. 4A to 4C. The operating period of the excimer laser 1 consists of iterations of an irradiation period for irradiation with pulse light and a non-irradiation period (non-operating period). The proportion of the sum of irradiation periods to the operating period of the excimer laser 1 (i.e., (the sum of irradiation periods)/(the sum of irradiation periods+the sum of non-operating periods)) will be referred to as a "duty". The duty is 100[%] when the excimer laser 1 is operating with its maximum oscillation frequency (FIG. 4A). For example, two methods can be used to change the duty.

The first method properly inserts non-operating periods while maintaining the maximum oscillation frequency of the excimer laser. That is, an "oscillation duty" is changed. When non-operating periods are inserted to stop the excimer laser from oscillating during the periods, as shown in FIG. 4B, the duty can be decreased. In the example shown in FIG. 4B, the duty can be expressed as 66[%] in consideration of the proportion between the sum of non-operating periods and that of irradiation periods.

The second method changes the oscillation frequency of the excimer laser within an arbitrary frequency range below the maximum oscillation frequency. As shown in FIG. 4C, if the oscillation frequency decreases, the light quantity per unit time decreases. This can obtain the same effect as that obtained when the oscillation duty is low. In the example shown in FIG. 4C, the oscillation frequency is one-quarter that of the example shown in FIG. 4A, and the light quantity per unit time decreases by a factor of four. Hence, the duty can be expressed as 25[%].

That is, the duty of the excimer laser 1 depends on the oscillation frequency and oscillation duty and can be calculated by:

$$\text{duty} = 1 \times D \times (f/f_{MAX}) \quad (1)$$

where D is the oscillation duty of the excimer laser 1, f is the oscillation frequency (at which the excimer laser oscillates) of the excimer laser 1, and $f_{MAX}$ is the maximum oscillation frequency of the excimer laser 1.

Energy $E_{AVE}$ per unit time of light emitted from the excimer laser 1 can be expressed using the product of the duty and energy $E_P$ per pulse, as given by:

$$E_{AVE} = \text{duty} \times E_P \quad (2)$$

Figure 5:
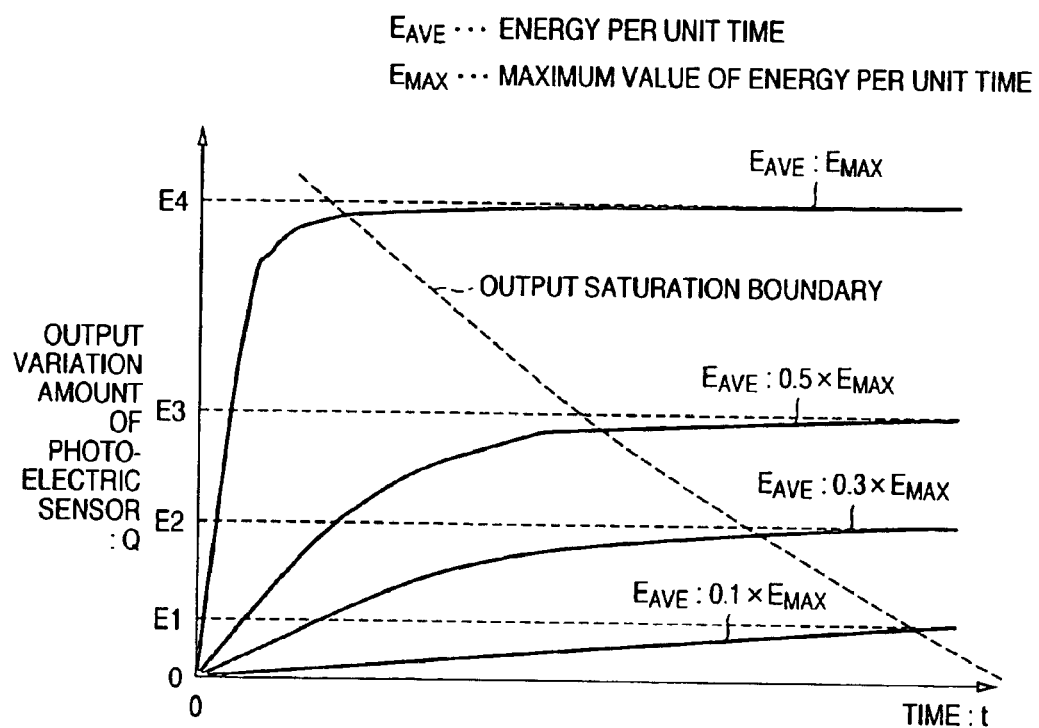
FIG. 5 is a graph showing an example of the time characteristic of the output variation amount of a photoelectric sensor.

The output characteristics of the photoelectric sensors (the illuminance uniformity sensor 13 and integrated exposure amount sensor 15) to be corrected using the present invention will be described next. Each photoelectric sensor can be, e.g., a single photodiode or an array of photodiodes. FIG. 5 is a graph showing an example of the time characteristic of the output variation of the photoelectric sensor (the illuminance uniformity sensor 13 or integrated exposure amount sensor 15). In FIG. 5, the abscissa represents time, and the ordinate represents an output variation amount Q when the photoelectric sensor 13 (or 15) is irradiated with light having predetermined energy $E_{AVE}$. Referring to FIG. 5, the quantity (integrated value) of irradiation light increases with time. This changes the temperature of the photoelectric sensor 13 (or 15), which in turn increases the output variation amount. Note that the temperature of the photoelectric sensor 13 (or 15) is changed by heating its light-receiving surface by the energy of the irradiation light.

After a further elapse of time, a change in sensitivity caused by a change in temperature saturates, and the output variation amount saturates. This is because the amount of heat generated on the light-receiving surface of the photoelectric sensor 13 (or 15) by the energy of irradiation light becomes equal to the amount of heat released to its surroundings, and the temperature stabilizes. The output variation amount saturates in a shorter time and becomes larger with increasing energy of light per unit time.

Figure 6:
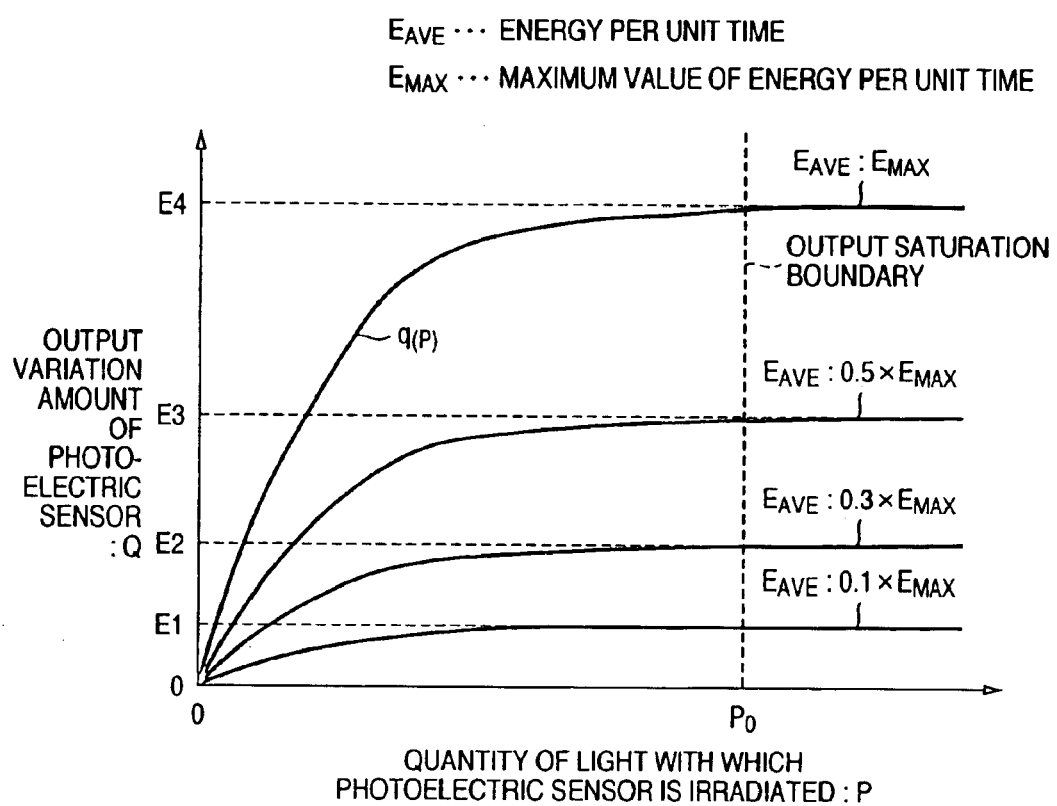
FIG. 6 is a graph showing an example of the output variation characteristic of the photoelectric sensor with respect to the quantity of light with which the photoelectric sensor is irradiated.

FIG. 6 is a graph showing an example of the output characteristic of the photoelectric sensor with respect to the quantity of light with which the photoelectric sensor is irradiated. In FIG. 6, the abscissa represents a quantity P of light with which the photoelectric sensor is irradiated, and the ordinate represents the output variation amount Q of the photoelectric sensor with respect to the light quantity P when the photoelectric sensor is irradiated with light having predetermined energy $E_{AVE}$. The light quantity P can be calculated by equation (3) on the basis of the energy $E_{AVE}$ and a time t. Note that the light quantity P calculated by equation (3) is equivalent to the product of the number of pulses of pulse light generated by the excimer laser 1 and the energy $E_P$ per pulse, and that the light quantity P can be calculated on the basis of this product.

$$P = E_{AVE} \times t \quad (3)$$

As shown in FIG. 6, $E_{AVE}$ and the output variation amount Q have a proportional relationship. Accordingly, letting $q_{(P)}$ be an output variation characteristic with respect to the light quantity P for $E_{MAX}$, the output variation amount Q can be represented by:

$$Q = (E_{AVE}/E_{MAX}) \times q_{(P)} \quad (4)$$

In illuminance uniformity measurement, the illuminance uniformity sensor 13 can be stepped in a slit direction by a regular distance, and the light quality P can be measured after each stepping. When the light quantity P is measured at each step, the illuminance uniformity sensor 13 is irradiated with pulse light having a predetermined number of pulses (e.g., several tens of pulses to several hundreds of pulses) while scanning in a scanning direction. The average value of values detected by the illuminance uniformity sensor 13 can be set as the light quantity of each step.

Figure 7:
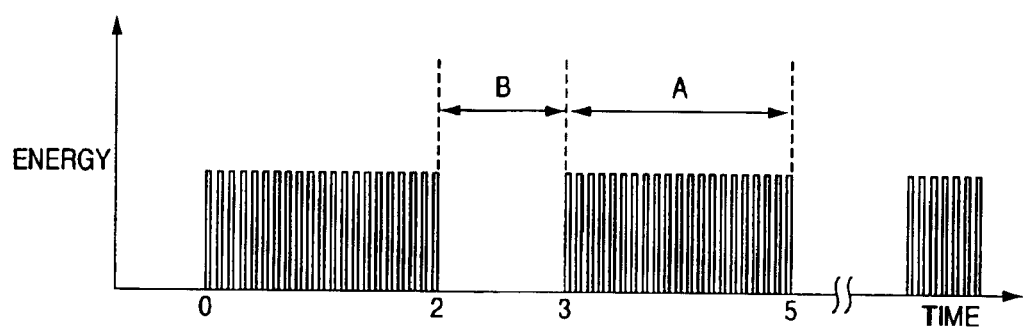
FIG. 7 is a chart showing an example of the time characteristic of pulse light with which the photoelectric sensor is irradiated.

More specifically, the illuminance conformity sensor 13 is irradiated with pulse light as shown in FIG. 7. A region B in FIG. 7 represents a period during which the illuminance uniformity sensor 13 is moved to the next step position. A region A represents a period during which the light quantity of each step is measured. In illuminance uniformity measurement, e.g., pulse light of several tens of pulses to several hundres of pulses can be emitted in the region A.

In normal exposure, the integrated exposure amount sensor 15 is also irradiated with pulse light shown in FIG. 7. In this case, the region B represents a period during which the stage 12 is moved for exposure of the next exposure region; and the region A, a period during which an exposure region is irradiated with pulse light while scanning the stage 12. Note that normal exposure performs exposure amount control, unlike illuminance uniformity measurement, and thus there are some variations in energy between pulse light beams.

A method of correcting an output variation due to a change in temperature of the photoelectric sensor 13 (or 15) according to the preferred embodiment will be described. The following description assumes a case wherein the photoelectric sensor 13 (or 15) is irradiated with light in accordance with the time characteristic shown in FIG. 8. Procedures for correcting the output value of the photoelectric sensor 13 (or 15) at a point S in FIG. 8 will be explained.

First, in step 1, the characteristic specified by a function $q_{(P)}$ as shown in FIG. 6 is stored in advance in a memory (e.g., a memory 21 in the control system 16) arranged inside or outside the exposure apparatus shown in FIG. 1. The function $q_{(P)}$ will be assumed to be stored in the memory 21 hereinafter. The function $q_{(P)}$ is determined on the basis of actual measurement, e.g., before or after incorporating the photoelectric sensor 13 (or 15).

The following steps are performed during operation of the exposure apparatus.

Figure 8:
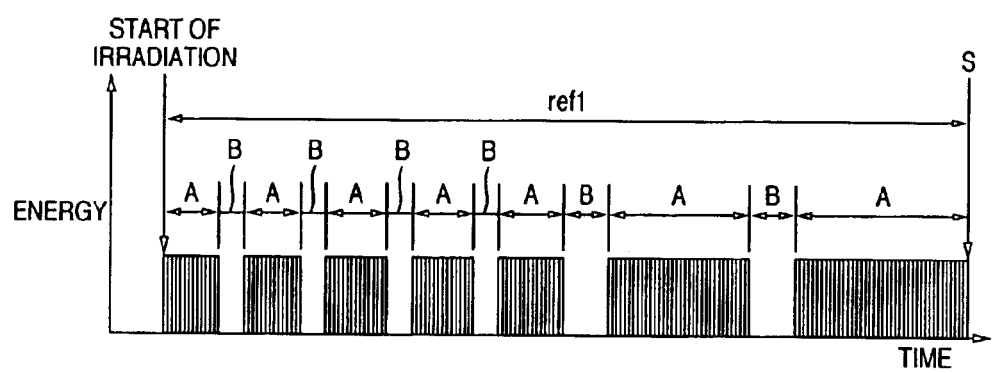
FIG. 8 is a chart showing an example of the time characteristic of pulse light with which the photoelectric sensor is irradiated.

In step 2, to estimate the output variation amount of the photoelectric sensor at the point S in FIG. 8, a calculator 22 in the control system 16 calculates the energy per unit time and the light quantity (the integarated quantity of light with which the photoelectric sensor 13 (or 15) is irradiated) during a period (a region ref1 in FIG. 8) from when irradiation of the photoelectric sensor 13 (or 15) with pulse light starts to the point S in accordance with equations (2) and (3), respectively. The duty in equation (2) is determined by parameters which the control system 16 provides for the excimer laser 1 and is already known in the control system 16. That is, the duty can be calculated by the calculator 22 in accordance with the method described with reference to FIG. 4. $E_P$ (energy per pulse) in equation (2) is given in advance to the control system 16 as a parameter. In equation (3), t (time) corresponds to ref1.

In step 3, the calculator 22 calculates the output variation amount Q of the photoelectric sensor 13 (or 15) at the point S using the light quantity P and the energy $E_{AVE}$ per unit time obtained in step 2 as parameters in accordance with the characteristic specified by the function $q_{(P)}$ stored in the memory 21. More specifically, the output variation amount Q with respect to the light quantity P obtained in step 2 when the energy $E_{AVE} = E_{MAX}$ is calculated on the basis of the function $q_{(P)}$. By substituting the value of Q into $q_{(P)}$ in equation (4) and the value of the energy $E_{AVE}$ into equation (4), the output variation amount Q at the light quantity P obtained in step 2 and the energy $E_{AVE}$ per unit time can be calculated.

In step 4, a compensator 23 in the control system 16 corrects the value of an output signal actually obtained from the photoelectric sensor 13 (or 15) on the basis of the output variation amount Q at the point S in FIG. 8, which is obtained in step 4. More specifically, the compensator 23 subtracts the output variation amount Q at the point S from the value of the output signal of the photoelectric sensor 13 (or 15), thereby obtaining an accurate measurement value at the point S.

The above description is not intended to perform correction calculation by the compensator 23 only at the fixed point S (one timing) in exposure of one wafer. In practice, the compensator 23 performs correction calculation continuously or intermittently. That is, the compensator 23 can perform correction calculation every time an output value from the photoelectric sensor 13 (or 15) is needed.

When the above-mentioned correction calculation is performed for an output from each of the illuminance uniformity sensor 13 and integrated exposure amount sensor 15, an output variation amount due to a change in temperature of each photoelectric sensor can be corrected to accurately detect or estimate the illuminance uniformity and integrated exposure amount. This can adjust the integrated exposure amount and illuminance uniformity and thus can increase the exposure accuracy.

In addition, according to this embodiment, no temperature sensor is required for correction calculation. This solves a problem such as a correction error due to a temperature measurement error, an increase in complexity of the arrangement of, e.g., a stage due to a temperature sensor (and a decrease in temperature stability of the stage), an increase in cost, or the like.

The present invention can be applied to a case using a pulse light source as well as a case using a continuum source. The present invention can be applied to a stepper or any other type of exposure apparatus, in addition to a scanner.

An exposure apparatus according to the present invention can reduce, e.g., the integrated exposure amount from the target exposure amount and the illuminance nonuniformity. If the exposure apparatus is applied to a lithography process, a pattern can be formed at high precision and high yield. The lithography process may include, e.g., a step of applying a photosensitive agent to a substrate such as a wafer or glass plate, a step of transferring a pattern of a master onto the substrate coated with the photosensitive agent using an exposure apparatus, and a step of developing the substrate onto which the pattern is transferred.

According to the present invention, an output variation due to a change in temperature of a photoelectric sensor can accurately be corrected.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus which has a light source and transfers a pattern of an original to a substrate using light supplied from said light source, said apparatus comprising:

a photoelectric sensor used to control an amount of light to which the substrate is exposed;

a memory storing a first value for correcting an output value of said photoelectric sensor with respect to each accumulated energy of light, having a first power, with which said photoelectric sensor is irradiated;

a calculator which calculates a second value for correcting an output value of said photoelectric sensor corresponding to a second accumulated energy of light, having a second power, with which said photoelectric sensor is irradiated, based on the first value in said memory corresponding to the second accumulated energy, and a ratio of the second power to the first power; and a correction unit which corrects an output value of said photoelectric sensor using the second value.

2. An apparatus according to claim 1, wherein said light source is a pulse light source.

3. An apparatus according to claim 1, wherein said photoelectric sensor detects a light amount during exposure of the substrate.

4. An apparatus according to claim 1, further comprising a movable stage which holds the substrate, wherein said photoelectric sensor is arranged on said movable stage and detects uniformity of light, supplied from said light source, at said movable stage.

5. A device manufacturing method comprising steps of:

transferring a pattern of an original to a substrate using an exposure apparatus as recited in claim 1; and developing the substrate to which the pattern has been transferred.

6. An exposure method of transferring a pattern of an original to a substrate using light supplied from a light source, said method comprising steps of:

detecting an amount of light supplied from the light source using a photoelectric sensor used to control an amount of light to which the substrate is exposed;

storing a first value for correcting an output value of the photoelectric sensor in a memory with respect to each accumulated energy of light, having a first power, with which the photoelectric sensor is irradiated;

calculating a second value for correcting an output value of the photoelectric sensor corresponding to a second accumulated energy of light, having a second power, with which the photoelectric sensor is irradiated, based on the first value in the memory corresponding to the second accumulated energy, and a ratio of the second power to the first power; and correcting an output value of the photoelectric sensor using the second value.

7. A method according to claim 6, wherein the light source is a pulse light source.

8. A method according to claim 6, wherein the photoelectric sensor detects a light amount during exposure of the substrate.

9. A method according to claim 6, wherein the photoelectric sensor is arranged on a movable stage which holds the substrate and detects uniformity of light, supplied from the light source, at the movable stage.

* * * * *

UNITED STATES PATENT AND TRADEMARK OFFICE
CERTIFICATE OF CORRECTION

PATENT NO. : 6,882,407 B2
DATED : April 19, 2005
INVENTOR(S) : Tadahiro Asaishi

It is certified that error appears in the above-identified patent and that said Letters Patent is hereby corrected as shown below:

Column 1,
Lines 5-9, should be deleted and the following inserted therefor:
-- The present invention relates to an exposure apparatus suitable for manufacturing a device typified by, e.g., a semiconductor device or liquid crystal display device. --.
Line 13, "apparatus" should read -- apparatus, --.

Column 7,
Line 20, "conformity" should read -- uniformity --.
Line 27, "hundres" should read -- hundreds --.
Line 59, "integarated" should read -- integrated --.

Signed and Sealed this

Fourth Day of October, 2005

JON W. DUDAS
*Director of the United States Patent and Trademark Office*